United States Patent
Ota et al.

(10) Patent No.: US 8,481,969 B2
(45) Date of Patent: Jul. 9, 2013

(54) EFFECTIVE ALGORITHM FOR WARMING A TWIST AXIS FOR COLD ION IMPLANTATIONS

(75) Inventors: Kan Ota, Bedford, MA (US); William Davis Lee, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 13/150,822

(22) Filed: Jun. 1, 2011

(65) Prior Publication Data

US 2011/0297845 A1  Dec. 8, 2011

Related U.S. Application Data

(60) Provisional application No. 61/351,607, filed on Jun. 4, 2010.

(51) Int. Cl.
*H01J 37/18* (2006.01)
*G21K 5/00* (2006.01)

(52) U.S. Cl.
USPC .................................. 250/453.11; 250/492.1

(58) Field of Classification Search
USPC .......................................... 250/453.11, 492.1
See application file for complete search history.

(56) References Cited

U.S. PATENT DOCUMENTS

| | | | |
|---|---|---|---|
| 4,948,269 A | 8/1990 | Hamilton | |
| 5,636,098 A | 6/1997 | Salfelder et al. | |
| 5,754,391 A | 5/1998 | Bates | |
| 5,838,528 A | 11/1998 | Os et al. | |
| 5,975,536 A * | 11/1999 | Helgeland | 277/410 |
| 6,025,602 A | 2/2000 | Rose et al. | |
| 6,108,189 A | 8/2000 | Weldon et al. | |
| 6,433,346 B1 | 8/2002 | Hirayanagi | |
| 6,552,892 B2 | 4/2003 | Carroll et al. | |
| 6,629,423 B1 | 10/2003 | Hirooka et al. | |
| 6,684,652 B2 | 2/2004 | Kim et al. | |
| 7,033,443 B2 | 4/2006 | Kellerman et al. | |
| 7,105,838 B2 | 9/2006 | Naylor-Smith et al. | |
| 7,135,691 B2 * | 11/2006 | Vanderpot et al. | 250/492.1 |
| 7,323,695 B2 * | 1/2008 | Vanderpot et al. | 250/440.11 |
| 7,560,705 B2 | 7/2009 | Eiriksson et al. | |
| 7,697,260 B2 * | 4/2010 | Brown et al. | 361/234 |

(Continued)

OTHER PUBLICATIONS

Final Office Action dated Feb. 14, 2012 issued to U.S. Appl. No. 12/113,091.

(Continued)

*Primary Examiner* — Robert Kim
*Assistant Examiner* — Wyatt Stoffa
(74) *Attorney, Agent, or Firm* — Eschweiler & Associates, LLC (57) ABSTRACT

A method for warming a rotational interface in an ion implantation environment provides a scan arm configured to rotate about a first axis and an end effector coupled to the scan arm via a motor to selectively secure a workpiece. The end effector is configured to rotate about a second axis having a bearing and a seal associated with the second axis and motor. The motor is activated, and the rotation of motor is reversed after a predetermined time or when the motor faults due to a rotation the end effector about the second axis. A determination is made as to whether the rotation of the end effector about the second axis is acceptable, and the scan arm is reciprocated about the first axis when the rotation of the end effector is unacceptable, wherein inertia of the end effector causes a rotation of the end effector about the second axis.

16 Claims, 5 Drawing Sheets

U.S. PATENT DOCUMENTS

| | | | |
|---|---|---|---|
| 2001/0005595 | A1 | 6/2001 | Morita et al. |
| 2003/0161088 | A1 | 8/2003 | Migita |
| 2003/0221626 | A1* | 12/2003 | Leavitt et al. .................. 118/730 |
| 2004/0066601 | A1 | 4/2004 | Larsen |
| 2005/0121144 | A1 | 6/2005 | Edo et al. |
| 2005/0219786 | A1* | 10/2005 | Brown et al. .................. 361/234 |
| 2005/0263719 | A1 | 12/2005 | Ohdaira et al. |
| 2006/0060259 | A1 | 3/2006 | Devitt |
| 2006/0171094 | A1 | 8/2006 | Muka et al. |
| 2006/0219605 | A1 | 10/2006 | Devitt |
| 2007/0109714 | A1 | 5/2007 | Chung |
| 2008/0044938 | A1 | 2/2008 | England et al. |
| 2008/0105836 | A1* | 5/2008 | Eiriksson et al. .......... 250/522.1 |
| 2008/0144251 | A1* | 6/2008 | Tao et al. .................. 361/234 |
| 2009/0067114 | A1 | 3/2009 | Balan |
| 2009/0273878 | A1 | 11/2009 | Lee et al. |
| 2009/0277883 | A1 | 11/2009 | Tandou et al. |
| 2010/0090413 | A1* | 4/2010 | Mahoney et al. .............. 277/410 |
| 2010/0164303 | A1 | 7/2010 | Veneruso |
| 2010/0171044 | A1* | 7/2010 | Lee et al. .................. 250/491.1 |
| 2010/0181500 | A1 | 7/2010 | Chang et al. |
| 2011/0062806 | A1* | 3/2011 | Ohashi et al. .................. 310/55 |
| 2011/0291022 | A1 | 12/2011 | Lee et al. |
| 2011/0291023 | A1* | 12/2011 | Lee et al. .................. 250/453.11 |
| 2011/0291030 | A1 | 12/2011 | Lee |

OTHER PUBLICATIONS

Non-Final Office Action Dated Jun. 16, 2011 for U.S. Appl. No. 12/113,091. 14 Pages.
Final Office Action Dated Mar. 30, 2012 for U.S. Appl. No. 12/725,508.
U.S. Appl. No. 11/641,334 filed Dec. 19, 2006. 32 Pages.
U.S. Appl. No. 12/113,091 filed Apr. 30, 2008. 32 Pages.
Non-Final Office Action Dated Sep. 9, 2009 for U.S. Appl. No. 11/641,334, 16 pages.
Final Office Action dated Mar. 19, 2010 for U.S. Appl. No. 11/641,334. 18 pages.
U.S. Appl. No. 13/485,186, filed May 31, 2012. 20 Pages.
Non-Final Office Action Dated Oct. 18, 2011 for U.S. Appl. No. 12/725,508.
Notice of Allowance Dated Apr. 6, 2009 for U.S. Appl. No. 11/840,888, 19 Pages.
U.S. Appl. No. 11/840,888 Filed Aug. 17, 2007. 27 Pages.
U.S. Appl. No. 12/725,508, filed Mar. 17, 2010. 21 Pages.
U.S. Appl. No. 13/116,661, filed May 26, 2011. 21 Pages.
"Porous Media Technology", New Way Air Bearings, Jan. 30, 2008, reprinted from the Internet at: http://www.newwayairbearings.com/porous-media-technology , 1 page.
Non-Final Office Action dated Sep. 12, 2012 for U.S. Appl. No. 13/116,661.
Final Office Action dated Jan. 7, 2013 for U.S. Appl. No. 13/116,661.
Notice of Allowance dated Dec. 11, 2012 issued to U.S. Appl. No. 11/641,334.
Office Action dated Mar. 20, 2013 for U.S. Appl. No. 13/485,186.
Office Action dated Mar. 25, 2013 for U.S Appl. No. 13/116,661.

* cited by examiner

FIG. 5

EFFECTIVE ALGORITHM FOR WARMING A TWIST AXIS FOR COLD ION IMPLANTATIONS

RELATED APPLICATIONS

This application claims priority to and the benefit of U.S. Provisional Application Ser. No. 61/351,607 which was filed Jun. 4, 2010, entitled "EFFECTIVE ALGORITHM FOR WARMING A TWIST AXIS FOR COLD ION IMPLANTATIONS", the entirety of which is hereby incorporated by reference as if fully set forth herein.

FIELD OF THE INVENTION

The present invention relates generally to ion implantation systems, and more specifically to warming a twist axis seal and/or bearing used in an ion implantation system having one or more chilled components.

BACKGROUND OF THE INVENTION

In the manufacture of semiconductor devices and other products, ion implantation systems are used to implant dopant elements into work pieces (e.g., semiconductor wafers, display panels, glass substrates). These ion implantation systems are typically referred to as "ion implanters".

Absent countermeasures, during the ion implantation process energy can build up on the workpiece 28 in the form of heat as the charged ions collide with the workpiece. This heat can warp or crack the workpiece, which may render the workpiece worthless (or significantly less valuable) in some implementations.

In addition, even if the workpiece is not rendered worthless, this undesired heating can cause the dose of ions delivered to differ from the dosage desired, which can alter the functionality from what is desired. For example, if a dose of $1 \times 10^{17}$ atoms/cm$^3$ are desired to be implanted in an extremely thin region just below the outer surface of the workpiece, unexpected heating could cause the delivered ions to diffuse out from this extremely thin region such that the dosage actually achieved is less than $1 \times 10^{17}$ atoms/cm$^3$. In effect, the undesired heating can "smear" the implanted charge over a larger region than desired, thereby reducing the effective dosage to less than what is desired. Other undesirable effects could also occur.

In other instances it might be desirable to implant at a temperature below ambient temperature, to allow for desirable amorphization of the silicon wafer surface enabling ultra shallow junction formation in advanced CMOS integrated circuit device manufacturing.

For these and other reasons, cooling systems have been developed to allow the chuck to be cooled to very low temperatures. Although cooling systems are known in some respects, such as in plasma processing apparatuses, it is extremely difficult to integrate a vapor cooling system into an ion implanter due to the mechanical density of components near the workpiece. For example, electrostatic chucks in ion implanters are often considerably more complicated that those used in less complicated plasma processing apparatuses. The inventors have developed techniques and systems for cooling electrostatic chucks in ion implantation systems, which can reduce undesired heating of workpieces undergoing implantation. Other methods for cooling an electrostatic chuck could comprise circulating a chilled fluid through the chuck at roughly, or slightly below, the temperature desired for implant.

SUMMARY OF THE INVENTION

The inventors have found that upon cooling an electrostatic chuck, a rotation or "twist" of the electrostatic chuck may be adversely affected by cooling of the chuck, wherein seals and/or bearings are cooled and viscosity of fluids involved therein is deleteriously increased. Therefore, a method for heating a seal and/or bearing within cooled components of an ion implantation system is provided herein, wherein the seal and/or bearing maintains the desired propensity to rotate.

Thus, the present invention overcomes the limitations of the prior art by providing a method, system, and apparatus for providing heat to a seal and/or bearing in a semiconductor processing system. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a method for heating a seal and/or bearing in an ion implantation system, and in one particular example, to a system for heating a seal and/or bearing in an ion implantation workpiece scanning system. The ion implantation workpiece scanning system, for example, comprises a scan arm configured to rotate about a first axis and an end effector that is rotatably coupled to the scan arm and configured to selectively secure a workpiece. The end effector may be optionally chilled to enable low temperature ion implantation. The end effector is configured to rotate about a second axis, also called a twist axis, wherein the first axis and second axis are positioned a predetermined distance apart, and wherein the end effector comprises a clamping plate such as an electrostatic chuck. One or more cooling mechanisms can be provided for cooling the clamping plate.

A bearing is positioned along the second axis, wherein the bearing rotatably couples the end effector to the scan arm, and a seal is positioned along the second axis, wherein the seal generally provides a pressure barrier between an external environment and an internal environment associated with an internal region of one or more of the scan arm and end effector. One or more of the bearing and seal can comprise a ferrofluidic seal. A heater assembly is optionally positioned proximate to the bearing and seal, wherein the heater assembly is configured to selectively provide a predetermined amount of heat to the bearing and seal, thereby decreasing the viscosity of the fluid, thus increasing a propensity of the end effector to rotate about the second axis.

The method comprises selectively rotating and counter-rotating the end effector about the second axis by one or more of a twist motor operably coupled to the end effector and the swing arm (also called a scan arm), wherein torque is applied to the end effector through inertial forces associated with the end effector and the rotation of the scan arm.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The inventors have developed techniques and systems for cooling electrostatic chucks in ion implantation systems, which can reduce undesired heating of workpieces undergoing implantation. One such device is disclosed in Non-provisional Patent Application having Ser. No. 12/725,508 filed May 3, 2010, entitled "VAPOR COMPRESSION REFRIGERATION CHUCK FOR ION IMPLANTERS," the contents of which is incorporated herein by reference in its entirety. Another method for cooling an electrostatic chuck comprises circulation of a chilled fluid through the electrostatic chuck at roughly, or slightly below, the temperature desired for implant. However, the inventors appreciate that upon cooling an electrostatic chuck, seals and/or bearings within the electrostatic chuck are also cooled, and a viscosity of fluids involved therein is deleteriously increased, therein adversely affecting a rotation or "twist" of the electrostatic chuck.

The present invention is thus generally directed toward a scan arm in an ion implantation system, and more particularly, to a system, apparatus, and method for warming or heating a rotational interface in an ion implantation environment, such as a seal and bearing on an end effector configured to rotate about an axis on the scan arm.

It will be appreciated that while heating may be particularly desirable in an ion implantation system that is adapted to provide low temperature implantation, the present invention may be equally adaptable to ion implantation systems that are not adapted to provide low temperature implantation. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

The present invention was generated as a solution to a problem that arose in adapting an ion implantation system to be configured to operate at temperatures lower than ambient temperature, wherein various moving components can freeze up, and potentially fail, or at least fail to perform adequately. Specifically, bearings and seals that contain ferro-fluids, oils, hydrocarbons, Fluorocarbons, or other types of grease, can require great amounts of torque to overcome the increase in viscosity as they cool down. The present invention overcomes this problem by advantageously utilizing friction to keep the seal and or bearing warm.

Figure 1:
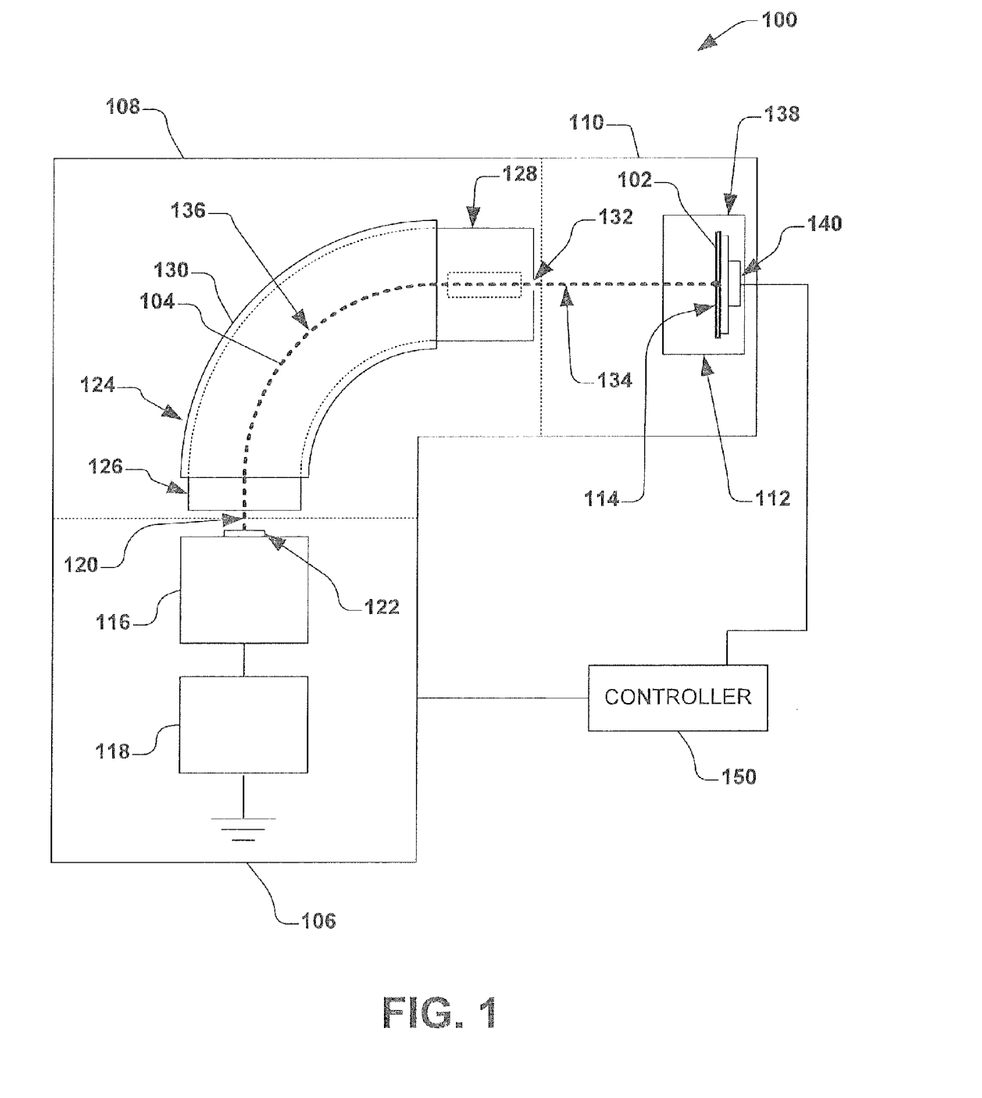
FIG. 1 illustrates a block diagram of an exemplary ion implantation system.

Referring now to the figures, in accordance with one exemplary aspect of the present invention, FIG. 1 illustrates an exemplary ion implantation system 100, wherein the ion implantation system is operable to scan a workpiece 102 (e.g., a semiconductor substrate or wafer) relative to an ion beam 104, therein implanting ions into the workpiece. As stated above, various aspects of the present invention may be implemented in association with any type of ion implantation apparatus, including, but not limited to the exemplary system 100 of FIG. 1. The exemplary ion implantation system 100 comprises a terminal 106, a beamline assembly 108, and an end station 110 that generally forms a process chamber 112, wherein the ion beam 104 is generally directed at the workpiece 102 positioned at a workpiece location 114. An ion source 116 in the terminal 106 is powered by a power supply 118 to provide an extracted ion beam 120 (e.g., an undifferentiated ion beam) to the beamline assembly 108, wherein the ion source comprises one or more extraction electrodes 122 to extract ions from the source chamber and thereby to direct the extracted ion beam toward the beamline assembly 108.

The beamline assembly 108, for example, comprises a beamguide 124 having an entrance 126 proximate to the source 116 and an exit 128 proximate to the end station 110. The beamguide 124, for example, comprises a mass analyzer 130 (e.g., a mass analysis magnet) that receives the extracted ion beam 120 and creates a dipole magnetic field to pass only ions of appropriate energy-to-mass ratio or range thereof through a resolving aperture 132 to the workpiece 102. The ions passed through the mass analyzer 130 and exit the resolving aperture 132 generally define a mass analyzed or desired ion beam 134 having ions of the desired energy-to-mass ratio or range thereof. Various beam forming and shaping structures (not shown) associated with the beam line assembly 108 may be further provided to maintain and bound the ion beam 104 when the ion beam is transported along a desired beam path 136 to the workpiece 102.

In one example, the desired ion beam 134 is directed toward the workpiece 102, wherein the workpiece is generally positioned via a workpiece scanning system 138 associated with the end station 110. The end station 110 illustrated in FIG. 1, for example, may comprise a "serial" type end station that provides a mechanical scanning of the workpiece within the evacuated process chamber 112, in which the workpiece 102 (e.g., a semiconductor wafer, display panel, or other workpiece) is mechanically translated through the beam path 136 in one or more directions via a workpiece scanning system 138. According to one exemplary aspect of the present invention, the ion implantation system 100 provides the desired ion beam 134 (e.g., also referred to as a "spot beam" or "pencil beam") as being generally stationary, wherein the workpiece scanning system 138 generally translates the workpiece 102 in two generally orthogonal axes with respect to the stationary ion beam. It should be noted, however, that batch or other type end stations may alternatively be employed, wherein multiple workpieces 102 may be scanned simultaneously, and such end stations are contemplated as falling within the scope of the present invention.

In another example, the system 100 may comprise an electrostatic beam scanning system (not shown) operable to scan the ion beam 104 along one or more scan planes relative to the workpiece 102. Accordingly, the present invention further contemplates any scanned or non-scanned ion beam 104 as falling within the scope of the present invention. In accordance with one embodiment of the present invention, the workpiece scanning system 138 of FIG. 1 comprises a scan arm 140, wherein the scan arm is configured to reciprocally scan the workpiece 102 with respect to the ion beam 104. The ion implantation system 100, for example, is further controlled by a controller 150, wherein functionality of the ion implantation system and workpiece scanning system 138 is controlled via the controller.

Figure 2:
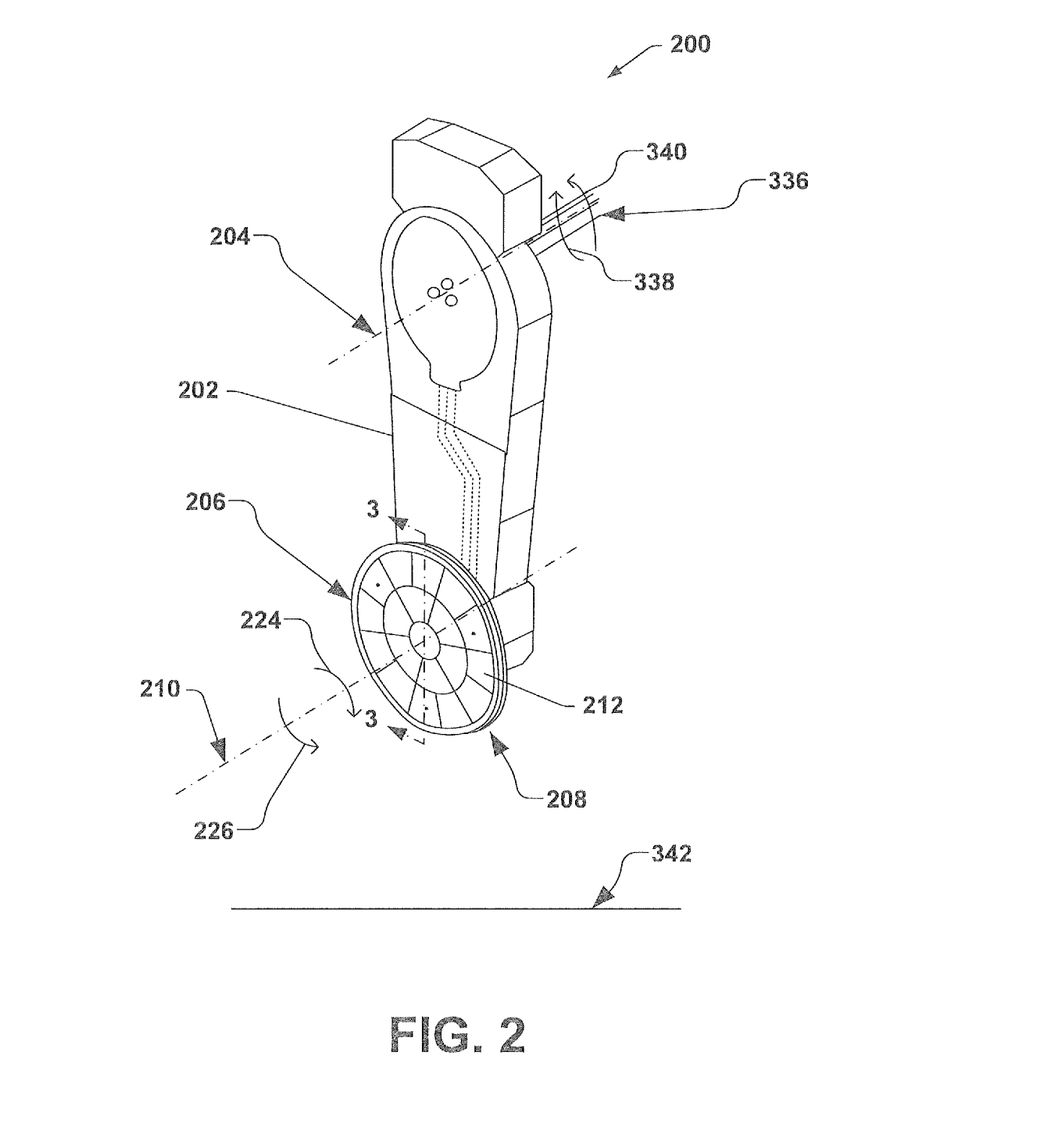
FIG. 2 illustrates an exemplary workpiece scanning system in accordance with one aspect of the invention.

FIG. 2 illustrates an ion implantation workpiece scanning system 200, wherein the scanning system comprises an exemplary scan arm 202 configured to rotate about a first axis 204 in accordance with another aspect of the invention. The scanning system 200 further comprises a chilled end effector 206 rotatably coupled to an end 208 of the scan arm 202 and configured to selectively secure a workpiece (not shown), wherein the chilled end effector is further configured to rotate about a second axis 210, also called a "twist axis", wherein the first axis 204 and second axis are positioned a predetermined distance apart. The chilled end effector 206 comprises a clamping plate 212 (e.g., also called an electrostatic chuck) and one or more cooling mechanisms 214 configured to cool the clamping plate.

It will be understood that while the present invention is described in connection with the ion implantation workpiece scanning system 200 of FIG. 2, wherein the exemplary scanning system comprises the exemplary scan arm 202 configured to rotate about the first axis 204 for translating the workpiece 102 of FIG. 1 through the ion beam 104, the invention is equally applicable to any ion implantation workpiece scanning system configured to laterally and/or arcuately translate the workpiece through the ion beam, and all such scanning systems are contemplated as falling within the scope of the present invention. Several exemplary aspects of the scan arm 202 and chilled end effector 206 are described in co-owned U.S. Pat. No. 7,560,705, entitled "Workpiece Handling Scan Arm for Ion Implantation System", and U.S. Nonprovisional Patent Application Ser. No. 12/725,508, entitled "Vapor Compression Refrigeration Chuck for Ion Implanters", the contents of which are incorporated by reference herein, in their entireties.

Figure 3:
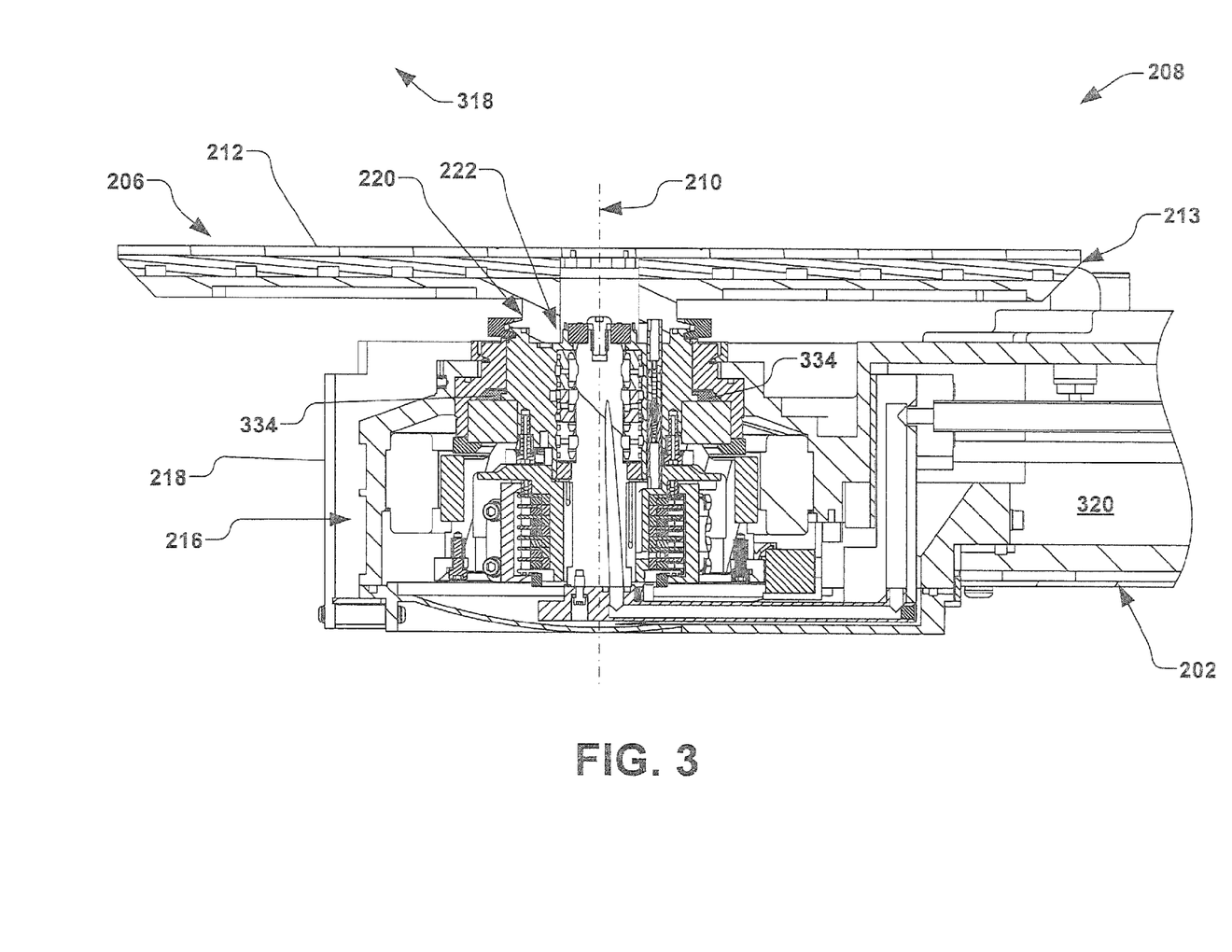
FIG. 3 illustrates a cross-sectional view of an end of an exemplary scan arm in accordance with another aspect of the invention.

FIG. 3 illustrates an enlarged view of the end 208 of the scan arm 202 of FIG. 2, wherein various features of the present example are illustrated in greater detail. For example, the scan arm 202 comprises a twist head 216 configured to provide both cooling of the clamping plate 212 (e.g., an electrostatic chuck 213) and selectively rotate the clamping plate about the second axis 210. The twist head 216, for example, comprises an enclosure 218 that is generally fixed with respect to the scan arm 202. A wedge mount 220, for example, is further provided, wherein the wedge mount operably couples the end effector 206 to a rotatable shaft 222 of the twist head 216. The rotatable shaft 222 is operable to rotate about the second axis 208 with respect to the enclosure 218 of the twist head 216, thus providing rotation to the wedge mount 220 and associated clamping plate 212.

In one example, as illustrated in FIG. 2, rotation 224 and counter-rotation 226 of the end effector 206 about the second axis 210 is utilized during ion implantation to achieve proper alignment of the workpiece 102 of FIG. 1. The rotation in a first rotational direction 224 and/or a second rotational direction 226 about the twist axis 210, for example, can also be implemented to implant ions into the workpiece 102 with a "twist angle" relative to the incident ion beam 134 of FIG. 1.

Figure 4:
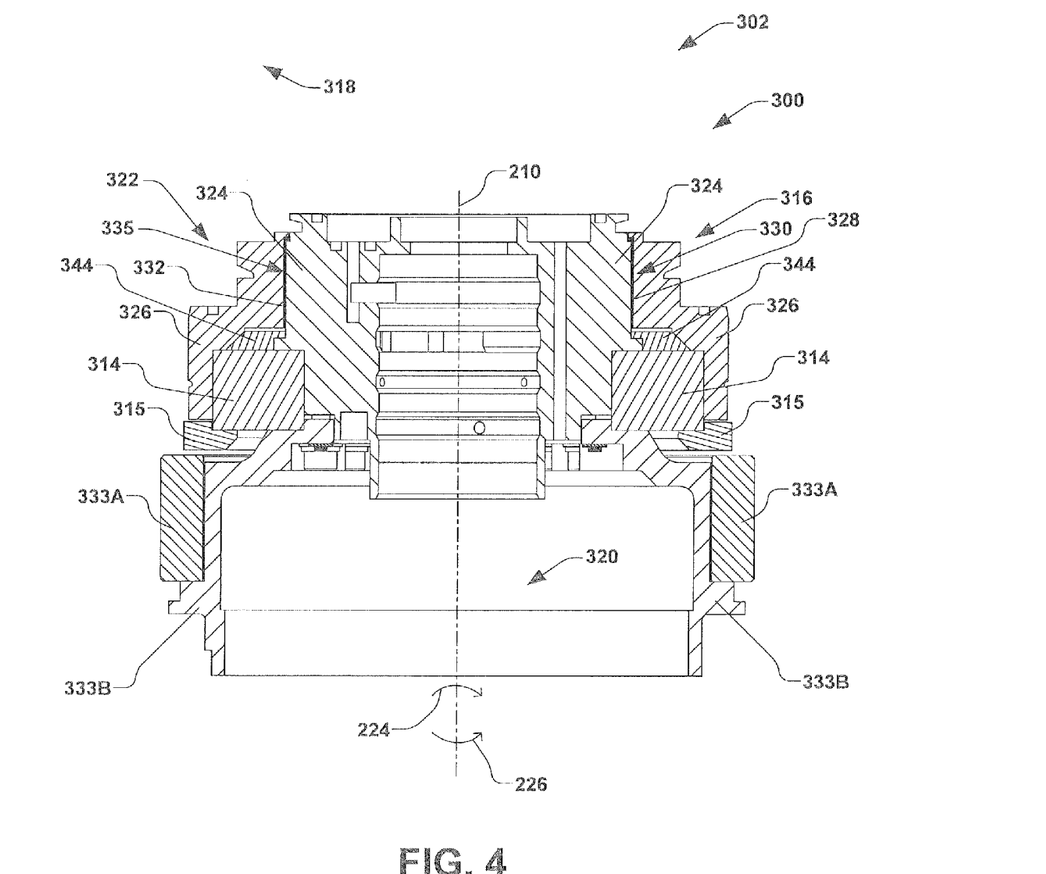
FIG. 4 illustrates a partial cross section of an exemplary end effector in accordance with yet another aspect of the invention.

In accordance with another exemplary aspect of the disclosure, FIG. 4 illustrates a portion 300 of another exemplary twist head 302, such as that illustrated in FIG. 3, wherein various components such as the clamping plate 212 and wedge mount 220 are removed for clarity. As illustrated in FIG. 4, a bearing assembly 314 is positioned along the second axis 210, wherein the bearing rotatably couples the end effector 206 to the scan arm 202 of FIG. 3. The bearing assembly 314, for example, comprises a cross roller-bearing held by a bearing retainer 315, wherein lubricating oil and/or grease is disposed therein for maintaining a low-friction lubrication of the bearing. A seal assembly 316 illustrated in FIG. 4 is further positioned along the second axis 210, wherein the seal assembly generally provides a pressure barrier between an internal environment 318 of the process chamber (e.g., the process chamber 112 of FIG. 1) and an external environment 320 (e.g., atmospheric) associated with an internal region of one or more of the scan arm 202 and end effector 206 of FIG. 3.

The seal assembly 316 of FIG. 4, for example, comprises a ferrous liquid rotary seal assembly 322 (also called a ferroseal or ferro-fluidic seal) configured to provide a rotary, hermetic seal between the external environment 320 and internal environment 318. For example, the ferrous liquid rotary seal assembly 322 comprises a rotor 324 operably coupled to the chilled end effector 206 of FIG. 3, and is configured to rotate about the second axis 210 of FIG. 4. A stator 326 is further positioned along the second axis 210 and configured to rotate the rotor 324, such as by a plurality of azimuthally-oriented magnets (not shown). One or more passages 328 are provided, such as an annular region 330 between the rotor 324 and stator 328 wherein a ferrofluid 332, for example, resides within the one or more passages 328.

Accordingly, the magnets of the stator 326 in the present example provide a magnetic field that crosses radially through the ferrofluid 332, and the magnetic flux returns through rotor 324 of the magnetic liquid rotary seal assembly 322 then back to the magnets of the stator 326. The ferrofluid 332, for example, is a type of oil with extremely fine iron particles disposed therein. The magnets of the stator 326, for example, cause the ferrofluid to align radially due to magnetization while sitting in magnetic field, thus providing a high degree of resistance to motion along the second axis 210 along this seal, thus providing a strong seal.

Furthermore, a number of chambers (not shown) are provided in the annular region 330, wherein, for example, each of the chambers are operable to hold off 1-3 psi of pressure between the external environment 320 and internal environment 318. Accordingly, when a plurality of chambers provided, a sufficient sealing is provided to seal the internal environment 318 (e.g., atmosphere at the lower side of seal) from the external environment 320 (e.g., vacuum at the upper side of seal). Since the magnetic field is in the direction of the rotation of the end effector 206 of FIG. 3 (e.g., radially), generally free rotation with minimal resistance is possible in the internal environment 318 (e.g., vacuum), while maintaining the sealing from the external environment 320 (e.g., atmosphere).

Lowering of the temperature of the chilled end effector 206 of FIG. 3, however, causes the viscosity of the fluid to increase. In order to achieve rotation of the chilled end effector 206, the rotor of a motor 333A, 333B of FIG. 4 is operably coupled thereto. The motor 333, for example, has a torque limit associated therewith that cannot be exceeded without the motor faulting. Thus, as the temperature of the chilled end effector 206 decreases (e.g., by internal cooling passages, etc., not shown), the viscosity of the ferrofluid and/or lubricating fluid in the seal assembly 316 increases, and the rotation can be deleteriously affected.

Furthermore, when the motor 333 is idled, therein idling the rotation in the first rotational direction and second rotational direction 226 of the end effector 206 of FIG. 2 for a period of time, such as between ion implantations, a "chaining effect" can occur, wherein magnetic particles of the ferrofluid 332 align, therein becoming generally rigid (e.g., also called "super-alignment"). The alignment of the magnetic particles can occur at room temperatures, but the chaining effect is especially evident when the ferrofluid 332 is cold and the end effector 206 is idled. Thus, as a consequence of the chaining effect of the ferrofluid 332, the viscosity (e.g., a measure of the resistance of the ferrofluid being deformed by either shear stress or tensile stress) increases in a manner similar to an increase in viscosity due to low temperatures. Accordingly, as the viscosity increases, the ferrofluid 332 becomes generally "rigid", thus leading to a larger torque that is required to rotate the motor 333.

Therefore, in accordance with the present disclosure, internal friction within the ferroseal 322 (e.g., friction within the ferrofluid 332, itself) is utilized to warm up the seal, therein advantageously decreasing the viscosity of the ferrofluid. For example, the motor 333 is utilized to apply a tiny force or "jerk" in the first rotational direction 224 and/or second rotational direction 226 around the second axis 210 (the twist axis). For example, the motor 333 is rotated back and forth in the first and second rotational directions 224 and 226, wherein the initial rotations may not yield a significant amount of rotational motion about the second axis 210. A minor amount of angular rotation (e.g., 0.1 degree), for example, may be initially achieved from the first rotations of the motor 333. From a control standpoint, the motor 333 may produce an over-torque error, indicating that the motor is unable to achieve greater rotational motion. However, if the rotational motion is quickly reversed (e.g., reversing the rotation from the first rotational direction 224 to the second rotational direction 226, or vice-versa), an increased angular rotation can be successively achieved. For example, a first rotation of 0.1 degrees is made in the first rotational direction 224 is followed by a second rotation of 0.2 degrees in the second direction 226, followed by a third rotation 0.5 degrees in the first rotational direction, and so on. The increase in angular rotation, for example, is a function of the torque limit of the motor 333, wherein the motor 333 is rotated until it faults due to over-torque.

Thus, in accordance with the present invention, the rotation and counter-rotation of the motor 333 in the first rotational direction 224 and second rotational direction 226 provides friction within the ferrofluid 332, itself (e.g., friction from the magnetic particles and lubricating oil of the ferrofluid), and thus, heat is advantageously provided internal to the ferroseal 322. The ferrofluid 332, for example, is confined in a minute volume 335 illustrated in FIG. 4 within the ferroseal 322. Thus, the friction provided by rotating the end effector 206 of FIG. 2 about the second axis 210 provides a large amount of heat relative to the volume of ferrofluid 332. Accordingly, the temperature of the ferrofluid 332 of FIG. 4 increases, thus decreasing the viscosity. The movement and decrease in viscosity breaks the chaining effect, and permits the ferroseal 322 to rotate more freely. By initially providing back and forth rotation (e.g., alternating first and second rotational directions 224 and 226 of rotation) in tenths of a degree, and incrementally increasing the rotation, after a certain number of rotations and counter-rotations (e.g., 10-20 alternating rotations about the second axis 210), it is possible to achieve 30-40 degrees of rotation in each direction. Accordingly, the friction induced by the rotation warms the ferrofluid 332 very effectively. The present invention contemplates the use of any motor associated with a ferroseal in an ion implantation system to provide incremental rotation and counter-rotation of the ferroseal, and any and all such use and/or apparatus involved in said use is contemplated as falling within the scope of the present invention.

In accordance with yet another aspect of the invention, the scan arm 202 of FIG. 2 is utilized to rotate the end effector 206. When utilized for ion implantation, the scan arm 202 swings about the first axis 204 (also called the "fast scan axis") like a pendulum, wherein a swing arm motor 336 is utilized to provide rotation and counter-rotation 338, 340 about the first axis. Kinematically, the end effector 206, for example, is free to rotate when the motor 333 is not energized. Thus, when the scan arm 202 is rotated about the first axis 204, inertia of the end effector 206 encourages the end effector to remain rotationally stationary with respect to a reference 342, such as ground. For example, in a frictionless situation where the scan arm 202 and end effector 206 are positioned vertically (e.g., the first axis 204 is at 0 degrees and the second axis 210 is at 180 degrees with respect to the first axis), due to inertia, a rotation of the scan arm by X degrees would result in a counter-rotation of the end effector by X degrees with respect to the scan arm, thus maintaining the orientation of the end effector with respect to the first axis. However, in practice, due at least in part to friction, when the end effector 206 is chilled and/or the chaining effect occurs within the ferroseal 322 of FIG. 4, the ferroseal will freeze the rotation of the end effector with respect to the scan arm 202.

The present invention accordingly takes advantage of the friction in the ferroseal 322 to warm the ferrofluid 332, therein decreasing its viscosity and again permitting rotation of the end effector 206 with respect to the scan arm 202. For example, a predetermined amount of torque (e.g., a sudden impulse) associated with the first axis 204 if FIG. 2 is applied, thus providing a corresponding torque to the ferroseal 322 and ferrofluid 332 of FIG. 4 in order to induce friction internal to the ferrofluid, thus providing heat to the ferroseal. For example, first torque can be first applied to the second axis 210 of FIG. 2 by the motor 333 of FIG. 4, and if the first torque is insufficient to adequately rotate the end effector 206 about the second axis, a predetermined impulse of torque to the scan arm 202 (and thus, the first axis 204 as well as the second axis 210) induces torque to increase friction in order to break the chaining effect, increase temperature and decrease viscosity within the ferroseal 322 (e.g., to a lower viscosity at which the twist motor 333 is again operable without having a torque fault).

When time constraints are a factor, for example, utilizing the twist motor 333 to provide the torque to the ferroseal 322 of FIG. 4 is advantageous, as rotating about the second axis 210 via the twist motor can be performed independent of the location of the scan arm 202, and can be expeditiously performed due to limited mass of the end effector 206). However, as stated previously, if the twist motor 333 is incapable of overcoming the viscosity and/or chaining effect within the ferroseal 322, the rotation of the scan arm 202 is advantageously implemented to provide the desired torque at the second axis 210 (e.g., the twist axis). The rotation of the scan arm 202, for example, is performed at the beginning of a series of ion implantations. During scanning associated with the ion implantations, the movement associated with the implant maintains a lower viscosity in the ferrofluid 332 of FIG. 4 and limits the delirious effects of the chaining effect.

It is appreciated by the inventors that a period of time of non-rotation of the end effector 206 can be determined, wherein the viscosity of the ferrofluid 332 is considered to be acceptable for rotation within the predetermined period of time. Exceeding the predetermined period of time while remaining stationary in one eample, however, would result in the viscosity and/or chaining effect of the ferrofluid 332 increasing, thus prescribing the above-described viscosity-lowering techniques to permit acceptable rotation, once again.

For example, when tuning the ion beam 134 of FIG. 1 or idling between implantations, a predetermined time period can transpire before ferrofluid 332 of FIG. 4 cools to a predetermined level, at which time, the twist motor 333 can no longer overcome friction and/or chaining effect. Accordingly, the scan arm 202 is moved to a position outside of ion beam 134 of FIG. 1, and the scan arm is rotated about the first axis 204, thus rotating the end effector 206 about the twist axis 210 as discussed above, thus further maintaining the viscosity of the ferrofluid 332 acceptably low. The predetermined time period, for example, is further dependent upon the temperature at which the implant is run, among other considerations.

According to another exemplary aspect, a heater assembly 344 illustrated in FIG. 4 is positioned proximate to the bearing assembly 314 and seal assembly 316, wherein the heater assembly is configured to selectively provide a predetermined amount of heat to the bearing and seal, therein decreasing a viscosity of the lubricating fluid and increasing a propensity of the chilled end effector 206 of FIG. 2 to rotate about the second axis 210.

The heater assembly 344, for example, is configured to provide energy (e.g., 100-120 W, up to or greater than 200 W), which is sufficient to locally heat the seal assembly 314, and thus keep the lubricating fluid (e.g., the ferrofluid 332) at a temperature where the viscosity is sufficient that viscous drag can be overcome by the torque allowable from the motor 333. The viscosity of the lubricating oil/grease in the bearing assembly 314 can be likewise decreased by the heater assembly 344. The heater assembly 344, for example, regionally heats chilled end effector 206, wherein the amount of heat provided by the heater assembly is controlled so as to provide the advantageous lower viscosity in the lubricating fluid, while not deleteriously affecting the desired cooling at the clamping plate 212 (e.g., the electrostatic chuck 213) or the workpiece 102 of FIG. 1.

Accordingly, as some of the passageways utilized for the supply/return of cooling fluid to the clamping plate 212 of FIG. 3 are run at very low temps (e.g., −50/−60 C), the heater assembly 344 of FIG. 4 is operable to maintain the cooling fluid relatively cold while providing an acceptable amount of heat (e.g., 100 W) at the radius at which the ferroseal 322 is positioned. Thus, the structure of the end effector 206 reasonably insulates the cooling fluid (to remain cold) while warming the ferrofluid 332 and bearing regions.

Figure 5:
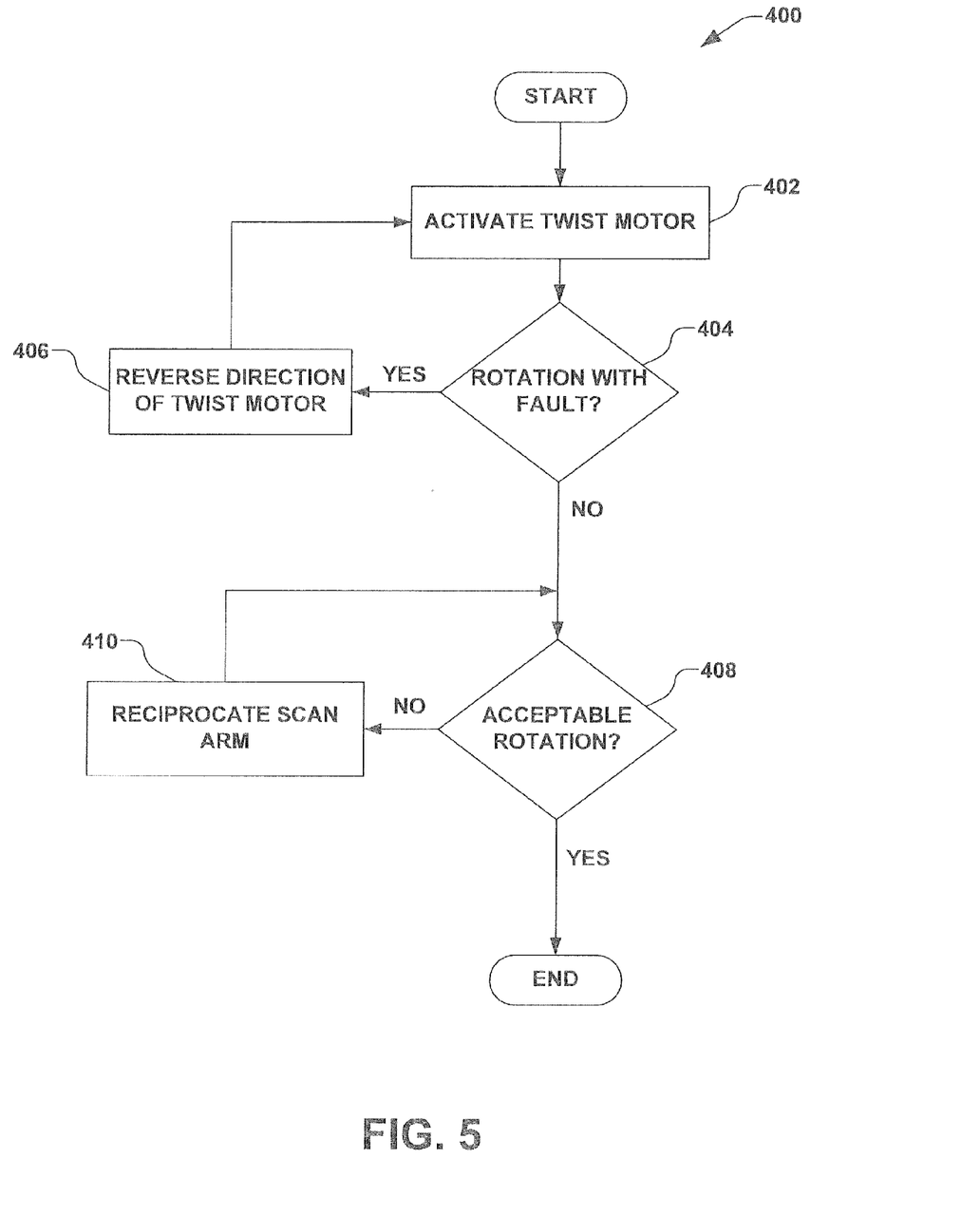
FIG. 5 is a method for heating a seal and/or bearing according to still another exemplary aspect of the invention.

In accordance with yet another aspect of the present invention, an exemplary method 400 is illustrated in FIG. 5 for warming a twist axis. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 5, the method 400 begins with act 402, wherein a twist motor is activated. The twist motor, for example, comprises the twist motor 333 of FIG. 4, wherein one or more ferroseals 322 provide for the rotation of the end effector 206 of FIG. 2 in the first and second rotational directions 224, 226. In accordance with the method 400 of FIG. 5, rotation is verified in act 404, as well as verifying whether the twist motor has faulted due to over-torque, as discussed above. If the end effector rotates, but the twist motor faults, the direction of the twist motor is reversed in act 406, and the twist motor is again activated in act 402. If the end effector fails to rotate in act 404, a determination is made as to whether the rotation of the end effector is acceptable. If the rotation about the twist axis is unacceptable in act 408, then a reciprocation of the scan arm about the first axis (e.g., also called the scan arm axis) is initiated in act 410. The reciprocation of the scan arm "jerks" the end effector, as discussed above, causing it to twist about the twist axis (e.g., the second axis), due, at least in part, to inertial effects associated with the end effector. The determination is then again made in act 408 as to whether the rotation of the end effector about the twist axis is acceptable. If the rotation about the twist axis is determined to be acceptable, further methods, such as an ion implantation into a workpiece, may be practiced utilizing the ion implantation system.

Likewise, if the determination in act 404 is such that the end effector rotates, but no fault associated with the twist motor is present, then the determination is made in act 408 as to whether the rotation is acceptable. Such an acceptable rotation indicates that the ferrofluid is warm and permits acceptable rotation of the end effector about the twist axis. Again, if the rotation is acceptable in act 408, the rotation of the twist axis is deemed to be acceptable, and the further methods may be practiced utilizing the ion implantation system.

Accordingly, the present invention provides a mechanism for heating one or more of a bearing and seal associated with a rotation of a chilled end effector in an ion implantation system. Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for warming a rotational interface in an ion implantation environment, the method comprising:
   providing a scan arm configured to rotate about a first axis and an end effector rotatably coupled to the scan arm via a twist motor and configured to selectively secure a workpiece, wherein the end effector is further configured to rotate about a second axis having a bearing and a seal associated with the second axis and twist motor, wherein the first axis and second axis are positioned a predetermined distance apart;
   activating the twist motor;
   performing one of reversing the rotation of the twist motor after a predetermined time and reversing the rotation of the twist motor when the twist motor faults;

determining whether the rotation of the end effector about the second axis is acceptable; and reciprocating the scan arm about the first axis when the rotation of the end effector is unacceptable, wherein inertia of the end effector causes a rotation of the end effector about the second axis.

2. The method of claim 1, wherein one or more of the bearing and seal comprise a ferrofluid.

3. The method of claim 1, wherein reversing the rotation of the twist motor after a predetermined time comprises successively incrementing a duration of the predetermined time.

4. The method of claim 1, wherein the rotation of the end effector about the second axis is determined to be acceptable when the end effector rotates a predetermined amount.

5. The method of claim 4, wherein the predetermined amount comprises a rotation about the second axis of approximately 30 degrees.

6. The method of claim 1, further comprising translating the scan arm in a direction generally perpendicular to the first axis, wherein reciprocating the scan arm about the first axis generally avoids an intersection of the end effector with a process medium.

7. The method of claim 6, wherein the process medium comprises an ion beam.

8. The method of claim 1, wherein reciprocating the scan arm about the first axis is performed concurrently with a period of time when the ion implantation is not being performed, therein maintaining a relatively low viscosity of the bearing and/or seal.

9. A method for warming a rotational interface in a chilled ion implantation environment, the method comprising:

providing an ion implantation system configured to produce an ion beam;

providing a workpiece scanning system configured to selectively pass a workpiece through the ion beam, wherein the workpiece scanning system comprises a scan arm configured to rotate about a first axis and an end effector rotatably coupled to the scan arm at a predetermined distance from the first axis, wherein the end effector is configured to selectively clamp the workpiece thereto, and wherein the end effector is configured to rotate about a second axis;

chilling the end effector, wherein one or more of a bearing and a seal associated with the rotation of the end effector about the second axis are chilled, wherein one or more of the bearing and seal comprise a ferrofluid, and wherein chilling the end effector decreases an ability of the end effector to rotate about the second axis; and rotating the scan arm about the first axis after chilling the end effector, wherein inertia of the end effector causes a rotation of the end effector about the second axis.

10. A method for warming a rotational interface in an ion implantation environment, the method comprising:

providing a scan arm having an end effector rotatably coupled thereto via a twist motor and configured to selectively secure a workpiece, said end effector having a bearing and a seal associated with the twist motor, wherein one or more of the bearing and seal comprise a ferrofluid;

activating the twist motor to rotate said end effector in a first direction; and selectively reversing the rotation of the twist motor after a predetermined time in order to maintain the rotatable coupling between said scan arm and said end effector, wherein activating the twist motor and reversing the direction of the twist motor are performed for a selected period of time for maintaining a predetermined viscosity of the ferrofluid.

11. A method for ion implantation, the method comprising:

translating a workpiece across an ion beam via an end effector rotatably coupled to a scan arm;

rotating the end effector about a first axis via a first axis motor, wherein a bearing positioned along the first axis rotatably couples the end effector to the scan arm, and a magnetic liquid seal positioned along the first axis further provides a protective barrier for the bearing; and providing a predetermined amount of heat to the bearing and magnetic liquid seal via selectively rotating the end effector about the first axis, therein maintaining a minimum propensity of the end effector to rotate about the first axis, wherein selectively rotating the end effector about the first axis comprises a selective rotation and counter-rotation of the end effector about the first axis based, at least in part, on feedback from the first axis motor and a predetermined degree of rotation of the end effector about the first axis.

12. The method of claim 11, further comprising chilling the end effector, therein increasing a viscosity of the magnetic liquid seal, and wherein the predetermined amount of heat is increased to counteract the increase in viscosity of the magnetic liquid seal.

13. A method for scanning a workpiece in an ion implantation system, the method comprising:

securing a workpiece to an end effector rotatably coupled to a scan arm via a twist motor, a bearing, and a seal positioned along a twist axis, wherein the seal generally provides a pressure barrier between an external environment and an internal environment associated with an internal region of one or more of the scan arm and end effector;

translating the workpiece across an ion beam; and selectively rotating and counter-rotating the end effector about the twist axis, wherein a predetermined amount of heat is provided to the bearing and seal, therein increasing a propensity of the end effector to rotate about the twist axis;

receiving feedback from the twist motor, wherein the selective rotation and counter-rotation of the end effector is based, at least in part, on the feedback from the twist motor; and reciprocating the scan arm about a first axis when the feedback from the twist motor indicates that the rotation and counter-rotation of the end effector is unacceptable, wherein the first axis and twist axis are separated by a predetermined distance, and wherein inertia of the end effector causes a rotation of the end effector about the twist axis.

14. The method of claim 13, wherein the seal comprises a magnetic liquid rotary seal assembly configured to provide a rotary, hermetic seal between the external environment and internal environment.

15. The method of claim 14, wherein the twist motor comprises a rotor configured to rotate about the twist axis and a stator that is generally fixed with respect to the scan arm, and wherein the magnetic liquid rotary seal comprises a ferrofluid disposed in an annular region between the rotor and stator.

16. The method of claim 13, wherein the end effector comprises a chilled electrostatic chuck configured to selectively electrostatically clamp the workpiece to a clamping surface thereof and to selectively cool the workpiece.

* * * * *